United States Patent
Joo

(10) Patent No.: US 7,668,030 B2
(45) Date of Patent: Feb. 23, 2010

(54) METHOD OF OPERATING A NON-VOLATILE MEMORY DEVICE

(75) Inventor: Byoung In Joo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 93 days.

(21) Appl. No.: 12/117,703

(22) Filed: May 8, 2008

(65) Prior Publication Data

US 2009/0231938 A1    Sep. 17, 2009

(30) Foreign Application Priority Data

Mar. 14, 2008    (KR) .................. 10-2008-0023845

(51) Int. Cl.
*G11C 7/00* (2006.01)
(52) U.S. Cl. .................. 365/203; 365/289.09; 365/204
(58) Field of Classification Search ................ 365/203, 365/204, 189.09, 189.14, 189.15
See application file for complete search history.

(56) References Cited

U.S. PATENT DOCUMENTS 5,587,951 A * 12/1996 Jazayeri et al. ............. 365/203
7,505,327 B2 * 3/2009 Edahiro et al. ......... 365/185.25

FOREIGN PATENT DOCUMENTS

KR    1020070004295 A    1/2007

* cited by examiner

*Primary Examiner*—Son Dinh
(74) *Attorney, Agent, or Firm*—Townsend and Townsend and Crew LLP

(57) ABSTRACT

A method of operating a non-volatile memory device reduces a time for discharging a precharged voltage when a program operation or a read operation is performed, thereby decreasing a total operation time of the non-volatile memory device. The non-volatile memory device discharges a bit line and a word line using only a control signal without reading an algorithm block when a precharged voltage is discharged. The method of operating a non-volatile memory device includes detecting an operation command; generating algorithm blocks for generating an operation voltage, for precharging a bit line and a word line, and for performing a specific operation in accordance with the operation command; outputting a discharge enable control signal for the bit line and the word line; and reading an algorithm of turning off and discharging a voltage generating means for generating the operation voltage.

9 Claims, 3 Drawing Sheets

METHOD OF OPERATING A NON-VOLATILE MEMORY DEVICE

CROSS-REFERENCE TO RELATED APPLICATIONS

This application claims priority from Korean Patent Application No. 10-2008-0023845, filed on Mar. 14, 2008, the contents of which are incorporated herein by reference in its entirety.

BACKGROUND OF THE INVENTION

The present invention relates to a method of operating a non-volatile memory device. More particularly, the present invention relates to a method of operating a non-volatile memory device that reduces a time for discharging a precharged voltage when a program operation or a read operation is performed, thereby decreasing a total operation time of the non-volatile memory device.

A non-volatile memory device generally has a memory cell array, a row decoder and a page buffer.

The memory cell array includes word lines extended along rows, bit lines extended along columns and cell strings corresponding to the bit lines.

The non-volatile memory device further includes a voltage providing circuit for generating a voltage for program or read of data, and a controller for outputting a control signal for controlling the voltage providing circuit, the page buffer, the row decoder, etc.

The controller has a storage means, and outputs the control signal for controlling in sequence operations of the non-volatile memory device in accordance with a pre-programmed algorithm when an operation command is input.

Hereinafter, the read operation in the non-volatile memory device will be described.

When a read command is input in the non-volatile memory device, the controller detects the read command and outputs the control signal for turning on the voltage providing circuit to generate the voltage for the read operation.

The voltage providing circuit includes a pumping circuit for generating a high voltage.

A pumping operation of the voltage providing circuit is started in accordance with the control signal of the controller. An operation voltage to be applied to a word line and a bit line selected for reading data is precharged after the high voltage is generated. The read operation for reading the data is then performed.

When the read operation is finished, data stored in a selected memory cell is stored in a latch of the page buffer. The stored data is output in accordance with the control signal of the controller. In addition, the word line, the bit line and the pumping circuit precharged for the read operation are discharged.

The controller outputs a discharge control signal for discharging the word line and the bit line. The voltage precharged to the word line and the bit line is discharged in accordance with the output discharge control signal.

The controller outputs a control signal for discharging the pumping circuit by turning off the pumping circuit after the word line and the bit line are discharged.

Operations in a program operation are similar to the above precharging and discharging operations.

In the program operation, a process of discharging the bit line and the word line and a process of discharging the pumping circuit are separately performed. However, a problem exists in that a total operation time in the non-volatile memory device is increased by separately performing the processes.

The non-volatile memory device pre-stores an algorithm block needed for operation thereof in a storage means such as a ROM included in the controller, and performs the operations in accordance with an order corresponding to the algorithm block. The algorithm block is divided into sub-blocks corresponding to the operations, and a sub-block required for a specific operation is read and used.

That is, to perform the above read operation, an upper data read algorithm for reading data is started.

A lower algorithm block for performing setup of the pumping circuit for generating high voltage is read and operated. In addition, a lower algorithm block for precharging the bit line and the word line is read and operated.

Subsequently, a data read algorithm block is read and operated, and an algorithm block for storing the read data in the page buffer is read and operated.

An algorithm block for discharging the word line and the bit line is read and operated, and an algorithm block for discharging the pumping circuit by turning off the pumping circuit is read and operated. In other words, the upper data read algorithm for the read operation is finished.

Since the algorithm blocks for discharge of the lines and discharge of the pumping circuit are independently performed, the operation time in the non-volatile memory device may be increased.

The non-volatile memory device is evaluated in accordance with the storage capacity of data and read/write velocity. Accordingly, rapid operation as well as storage capacity is important.

In the non-volatile memory device, a time for discharging the voltage affects the total operation time of the non-volatile memory device. Accordingly, the total operation time is increased as the time for discharging the voltage is augmented.

SUMMARY OF THE INVENTION

It is a feature of the present invention to provide a method of operating a non-volatile memory device for performing discharge of a bit line and a word line using only a control signal without reading an algorithm block when a precharged voltage is discharged.

A method of operating a non-volatile memory device according to one example embodiment of the present invention includes detecting an operation command; generating algorithm blocks for generating an operation voltage, for precharging a bit line and a word line, and for performing a specific operation in accordance with the operation command; outputting a discharge enable control signal for the bit line and the word line; and reading an algorithm of turning off and discharging a voltage generating means for generating the operation voltage.

A step of discharging the bit line and the word line is simultaneously performed with a step of discharging the voltage generating means.

The method further includes generating a word line voltage and a bit line voltage for a read operation through the voltage generating means; reading an algorithm block for precharging a corresponding word line and bit line when the operation command is a data read command; reading an algorithm for changing the voltage of the bit line in accordance with a data status of a memory cell selected for the read operation; reading an algorithm for sensing and latching data stored in the selected memory cell in accordance with the changed voltage; providing the discharge enable control signal to the bit line and the word line; and reading an algorithm block for turning off and discharging the voltage generating means.

A method of operating a non-volatile memory device according to another example embodiment of the present invention includes detecting a data read command; generating algorithm blocks for generating an operation voltage, for precharging a bit line and a word line, and for reading and storing data of a selected memory cell; outputting a discharge enable control signal for the bit line and the word line; and reading an algorithm for turning off and discharging a pumping circuit for generating the operation voltage.

The algorithm blocks read before discharging the bit line and the word line include an algorithm block configured to setup the pumping circuit for generating the operation voltage, an algorithm block configured to precharge the bit line and the word line, an algorithm block configured to read the data from the selected memory cell, and an algorithm block configured to latch the read data in a corresponding page buffer.

An algorithm block for discharging the pumping circuit is read and operated while the bit line and the word line are discharged.

A method of operating a non-volatile memory device according to still another example embodiment of the present invention includes detecting a program command; generating algorithm blocks for generating an operation voltage, for precharging a bit line and a word line, and for programming data in a selected memory cell; outputting a discharge enable control signal for the bit line and the word line; and reading an algorithm for turning off and discharging a pumping circuit for generating the operation voltage.

The algorithm blocks read before discharging the bit line and the word line include an algorithm block configured to setup the pumping circuit for generating the operation voltage, an algorithm block configured to precharge the bit line and the word line, an algorithm block configured to program the data in the selected memory cell, and an algorithm block configured to verify the program.

An algorithm block for discharging the pumping circuit is read and operated while the bit line and the word line are discharged.

As described above, a method of operating a non-volatile memory device outputs a control signal for discharging a bit line and a word line without reading an algorithm when a program operation or a read operation is performed. As a result, a total operation time in the non-volatile memory device may be reduced.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings.

Figure 1:
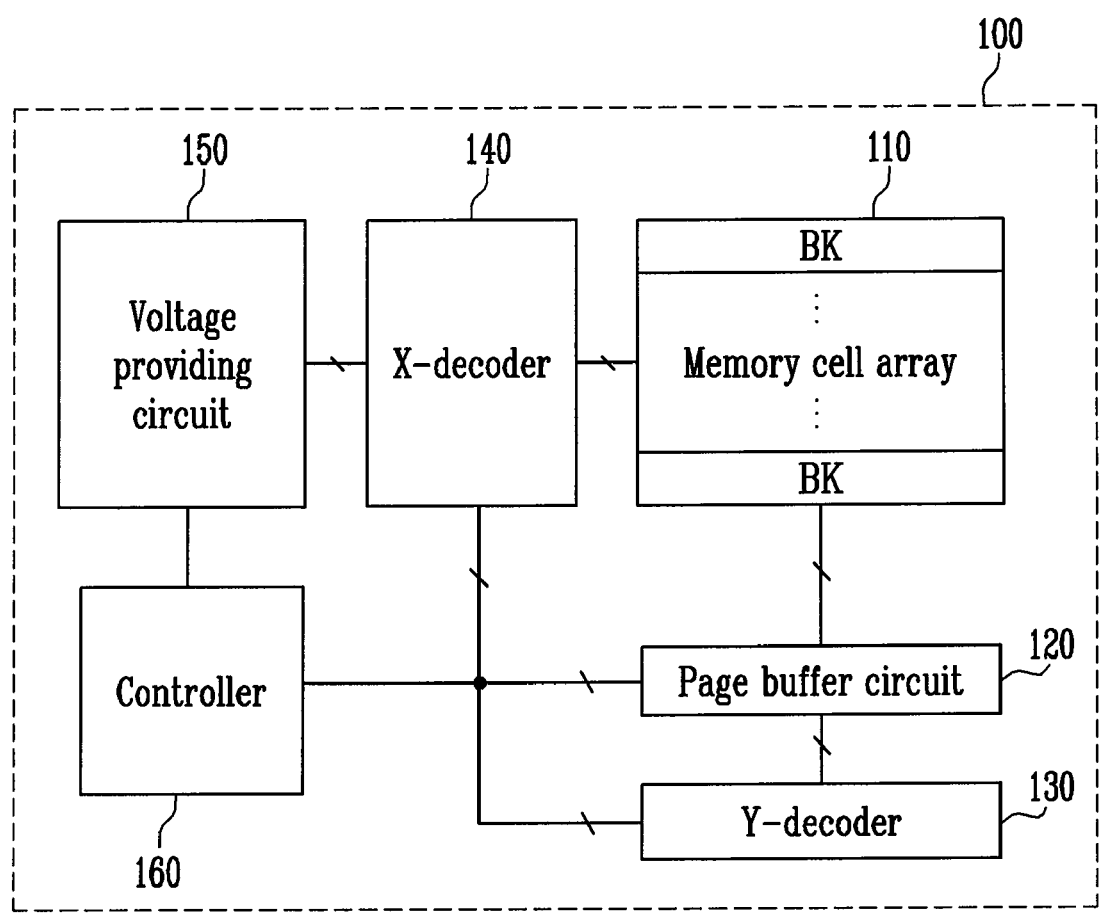
FIG. 1 is a block diagram illustrating a non-volatile memory device.

FIG. 1 is a block diagram illustrating a non-volatile memory device.

In FIG. 1, the non-volatile memory device 100 includes a memory cell array 110, a page buffer circuit 120, a Y decoder 130, an X decoder 140, a voltage providing circuit 150 and a controller 160.

In the memory cell array 110, memory cells for storing data are coupled to bit lines and word lines.

The page buffer circuit 120 has page buffers coupled to the bit lines of the memory cell array 110, for storing temporarily data for program and then providing the stored data to a corresponding bit line, or for sensing a voltage of the bit line and then storing temporarily data read from a corresponding memory cell in a read operation.

The Y decoder 130 provides a data input/output path to the page buffer circuit 120.

The X decoder 140 provides an operation voltage output from the voltage providing circuit 150 to the word lines of the memory cell array 110.

The voltage providing circuit 150 generates the operation voltage for a program operation and the read operation.

In addition, the voltage providing circuit 150 includes a pumping circuit for generating a high voltage.

The controller 160 controls the voltage providing circuit 150 to generate the operation voltage in accordance with an operation mode and to output a control signal for the program operation or the read operation.

Additionally, the controller 160 has a storage means. The controller 160 outputs the control signal for operation control in accordance with an operation algorithm stored as a program.

Hereinafter, the read operation in the non-volatile memory device will be described in detail.

Figure 2A:
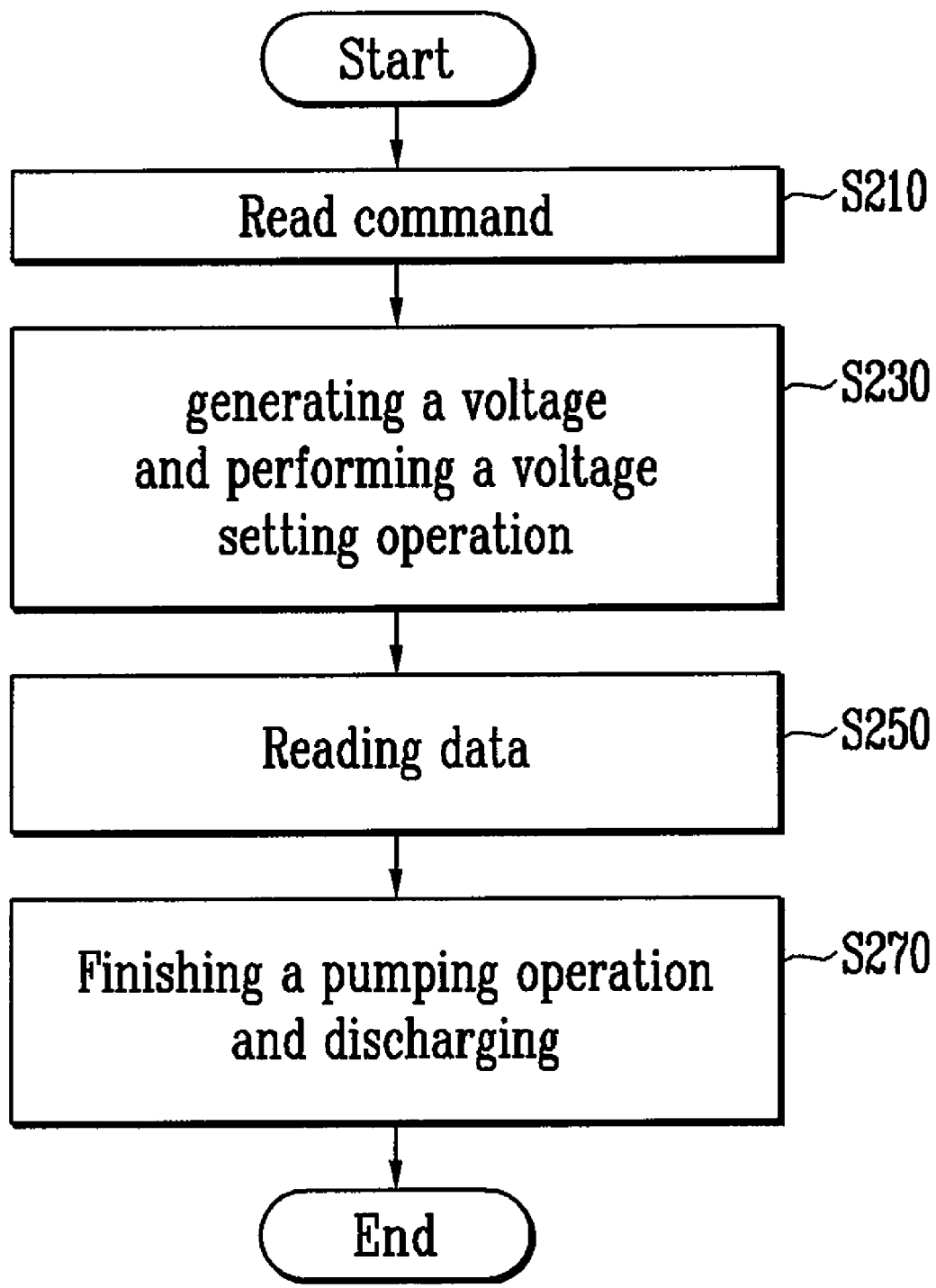
FIG. 2A is a flow chart illustrating a read operation according to one example embodiment of the present invention.

FIG. 2A is a flow chart illustrating a read operation according to one example embodiment of the present invention.

In FIG. 2A, the controller 160 of the non-volatile memory device 100 receives a data read command in step S210, and operates an algorithm for performing the read operation. Operations in accordance with the algorithms are pre-stored in the storage means in the controller 160, and are performed in sequence in accordance with the algorithms.

In step S230, the controller 160 controls the voltage providing circuit 150 to operate the pumping circuit for generating a high voltage in accordance with the read command, and performs a voltage setting operation of precharging a voltage to be provided to the word lines and the bit lines.

In step S250, a process of reading data is performed after the setting of the voltage is finished. Particularly, the voltage of a bit line coupled to a selected memory cell is changed, the voltage of the bit line is sensed by corresponding page buffer, and data read from the memory cell is stored in accordance with the sensed result.

In step S270, to discharge voltages of the bit line, the word line and the pumping circuit precharged in step S230, the controller 160 transmits a discharge enable control signal to the voltage providing circuit 150 after the process of reading the data is finished, thereby turning off the pumping circuit. The bit line and the word line are simultaneously discharged during discharge of the pumping circuit.

Hereinafter, operation of the non-volatile memory device will be described in detail.

Figure 2B:
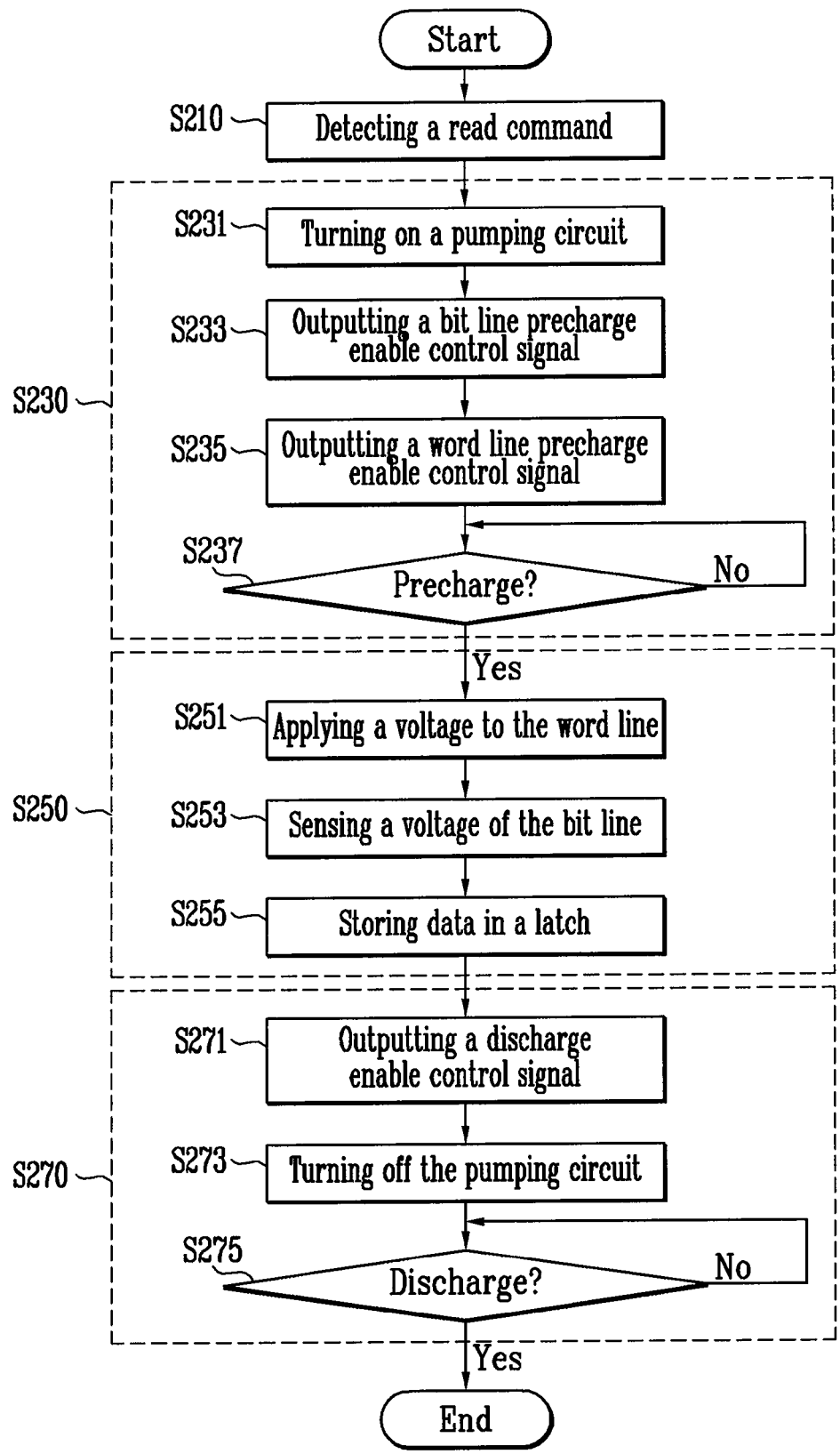
FIG. 2B is a flow chart illustrating in detail the operation in FIG. 2A.

FIG. 2B is a flow chart illustrating in detail the operation in FIG. 2A.

Referring to FIG. 2B, the controller 160 detects the read command when the read command is input and operates the algorithm for the read operation in step S210.

In step S230, the process of setting the voltage is performed.

Particularly, in step S231, the controller 160 turns on the pumping circuit in the voltage providing circuit 150 for generating a high voltage, and operates the pumping circuit until an output voltage of the pumping circuit reaches a given level.

In steps S233 and S235, the controller 160 outputs a bit line precharge enable control signal and a word line precharge enable control signal when the output voltage of the pumping circuit reaches the given level.

In step S237, the bit lines and the word lines are precharged by the output bit line precharge enable control signal and the output word line precharge enable control signal. A subsequent operation is not performed until the precharging operation is finished.

In step S250, the operation voltage setting is finished when the precharging operation is finished, and the process of reading data is performed.

Particularly, in step S251, the voltage precharged in the step S230 is applied to the word lines of the memory cell array 110.

In step S253, a sensing time is maintained so that the voltage of the bit line is changed in accordance with program status of corresponding memory cell.

In step S255, the page buffer senses the voltage of the bit line changed in accordance with the program status of the memory cell, and stores data read from the memory cell in a corresponding latch in accordance with the sensed result.

The data stored in the latch is output through the Y decoder 130 in accordance with the control signal output from the controller 160.

In step S270, the voltages precharged to the bit line, the word line and the pumping circuit are discharged after the read operation is finished.

Particularly, in step S271, the controller 160 provides the discharge enable control signals to the bit line and the word line. The controller 160 directly discharges the bit line and the word line by providing the control signal without reading an extra algorithm.

In step S273, the controller 160 turns off the pumping circuit of the voltage providing circuit 150, thereby discharging the pumping circuit.

In step S275, the bit line and the word line are simultaneously discharged while the pumping circuit is discharged.

Since the bit line and the word line are discharged by using only the control signal without reading algorithm, time for reading the algorithm is saved.

Particularly, an upper data read algorithm is started.

Subsequently, a lower algorithm block for performing a setup of the pumping circuit for generating a high voltage is read and operated.

Then, an algorithm block for precharging the bit line and the word line is read and operated.

Subsequently, an algorithm block for the read operation is read and operated, and an algorithm block for storing the read data in the page buffer is read and operated.

An algorithm block for discharging the word line and the bit line is not read, but the discharge enable control signal is output. The word line and the bit line are discharged in accordance with the discharge enable control signal. As a result, since the algorithm block for discharging is not read, discharge time is reduced.

In addition, an algorithm for discharging the pumping circuit by turning off the pumping circuit is read and operated. That is, the upper algorithm for reading data is finished.

The above process for discharging the bit line, the word line and the pumping circuit is not applied to only the read operation in FIG. 2A and FIG. 2B, and may be applied to other processes in which a discharge step is required.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other embodiments.

Although the present invention has been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement that are within the scope of the disclosure, the drawings and the appended claims. In addition to the variations and modifications in the component parts and/or arrangements, alternative uses will also be apparent to those skilled in the art.

What is claimed is:

1. A method of operating a non-volatile memory device, the method comprising:
   detecting an operation command;
   generating algorithm blocks for generating an operation voltage, for precharging a bit line and a word line, and for performing a specific operation in accordance with the operation command;
   outputting a discharge enable control signal for the bit line and the word line; and
   reading an algorithm of turning off and discharging a voltage generating means for generating the operation voltage.

2. The method of claim 1, wherein discharging the bit line and the word line is simultaneously performed with discharging the voltage generating means.

3. The method of claim 1, further comprising:
   generating a word line voltage and a bit line voltage for a read operation through the voltage generating means;
   reading an algorithm block for precharging corresponding to the word line and the bit line when the operation command is a data read command;
   reading an algorithm for changing the voltage of the bit line in accordance with a data status of a memory cell selected for the read operation;
   reading an algorithm for sensing and latching data stored in the selected memory cell in accordance with the changed voltage;
   providing the discharge enable control signal to the bit line and the word line; and
   reading an algorithm block for turning off and discharging the voltage generating means.

4. A method of operating a non-volatile memory device, the method comprising:
   detecting a data read command;
   generating algorithm blocks for generating an operation voltage, for precharging a bit line and a word line, and for reading and storing data of a selected memory cell;
   outputting a discharge enable control signal for the bit line and the word line; and reading an algorithm of turning off and discharging a pumping circuit for generating the operation voltage.

5. The method of claim 4, wherein the algorithm blocks read before discharging the bit line and the word line include:
   an algorithm block configured to setup the pumping circuit for generating the operation voltage;
   an algorithm block configured to precharge the bit line and the word line;
   an algorithm block configured to read the data from the selected memory cell; and
   an algorithm block configured to latch the read data in corresponding page buffer.

6. The method of claim 4, wherein an algorithm block for discharging the pumping circuit is read and operated while the bit line and the word line are discharged.

7. A method of operating a non-volatile memory device, the method comprising:
   detecting a program command;
   generating algorithm blocks for generating an operation voltage, for precharging a bit line and a word line, and for programming data in a selected memory cell;
   outputting a discharge enable control signal for the bit line and the word line; and
   reading an algorithm of turning off and discharging a pumping circuit for generating the operation voltage.

8. The method of claim 7, wherein the algorithm blocks read before discharging the bit line and the word line include:
   an algorithm block configured to setup the pumping circuit for generating the operation voltage;
   an algorithm block configured to precharge the bit line and the word line;
   an algorithm block configured to program the data in the selected memory cell; and
   an algorithm block configured to verify the program.

9. The method of claim 7, wherein an algorithm block for discharging the pumping circuit is read and operated while the bit line and the word line are discharged.

* * * * *